United States Patent [19]

Zanoni et al.

[11] Patent Number: 5,178,978
[45] Date of Patent: Jan. 12, 1993

[54] FABRICATING INTEGRATED OPTICS

[75] Inventors: Raymond Zanoni; Kent B. Rochford, both of Tucson, Ariz.

[73] Assignee: The United States of America as represented by the Secretary of the Air Force, Washington, D.C.

[21] Appl. No.: 578,963

[22] Filed: Sep. 6, 1990

[51] Int. Cl.⁵ .................... G03H 1/02; G03C 5/00; G03C 3/00
[52] U.S. Cl. .................................. 430/11; 430/13; 430/290; 430/270; 385/130; 385/122
[58] Field of Search .................... 430/290, 270, 11, 13; 385/130, 122

[56] References Cited

U.S. PATENT DOCUMENTS

| | | | |
|---|---|---|---|
| 3,723,121 | 3/1973 | Hauser | 430/20 |
| 3,864,130 | 2/1975 | Nassenstein et al. | 430/290 |
| 4,270,130 | 5/1981 | Houle et al. | 346/77 E |
| 4,515,429 | 5/1985 | Smith et al. | 385/122 X |
| 4,536,450 | 8/1985 | Garito | 430/270 |
| 4,578,344 | 3/1986 | Griffing et al. | 430/312 |
| 4,677,049 | 6/1987 | Griffing et al. | 430/339 |
| 4,678,736 | 7/1987 | Hanamura et al. | 430/270 |
| 4,824,522 | 4/1989 | Baker et al. | 385/130 X |
| 4,834,480 | 5/1989 | Baker et al. | 385/122 X |

OTHER PUBLICATIONS

K. B. Rochford et al., "Fabrication of integrated optical structures in polydiacetylene films by irreversible photoinduced bleaching," Appl. Phys. Lett. 55 (12), 18 Sep. 1989, pp. 1161-1163.

Primary Examiner—Cynthia Hamilton
Attorney, Agent, or Firm—Thomas C. Stover; Donald J. Siinger

[57] ABSTRACT

Method for fabricating components for integrated optics are provided wherein a film of poly-4BCMU on a glass substrate, is masked, e.g. with one or more metallic strips on a glass plate and such film is irradiated with, e.g. a UV lamp, tuned within the absorption band of such film, in air, to photobleach the film portions around channels covered by the masking strips and reduce the refractive index thereof below that of the unbleached film channels. The bleached film portions then provide reflective beam confining interfaces which define the unbleached channels and form waveguides within the film. The invention also provides for interfering two laser beams, of like λ, at a coupling spot on the film, which beams are again tuned within the absorption band of such film, which bleach alternate lines or bars of such film to provide a phase grating therein. A waveguide can be inscribed in such film to optically communicate with such phase grating and other components can be added such as optical interconnects, to direct light on various paths into and out of such integrated optical film circuit. The thus-formed circuit is preserved by encapsulating the so-bleached film in a layer of, e.g. epoxy, at a lower index of refraction than the unbleached film, while the glass substrate protects the reverse face of such film, which glass also has a lower index of refraction than the unbleached film so that the optical components of the invention, e.g. the waveguides, are enclosed on all sides by reflective interfaces of lower index of refraction to confine and channel transmitted light therein. The light can enter and exit the integrated optical circuit of the invention at a phase grating or where the waveguides reach the film edges. The invention takes advantage of photobleaching to change the index of refraction of portions of a thin film to define optical components therein and has located a class of films, the soluble polydiacetylenes, which, upon photobleaching, provide a considerable reduction in refractive index, enabling the definition of optical components in such film. The invention includes the methods of fabricating such integrated optics as well as the integrated optic products so-made.

28 Claims, 4 Drawing Sheets

FABRICATING INTEGRATED OPTICS

STATEMENT OF GOVERNMENT INTEREST

The invention described herein may be manufactured and used by or for the Government for governmental purposes without the payment of any royalty thereon

BACKGROUND OF THE INVENTION

1. Field of the Invention

This invention relates to fabricating integrated optics, including optics in polymer films, particularly polydiacetylene films.

2. Prior Art

Integrated optical circuits include optic components in a film, e.g, waveguides, optical interconnects, phase gratings and the like, which direct (or reflect) light beams in a desired direction. These components have been made in the past by a) ion exchange, a multi-step process wherein ions are exchanged in a glass substrate or b) ion milling, another multi-step process which requires a vacuum and an ion gun, both processes being relatively complex and cumbersome.

In the photobleaching prior art, U.S. Pat. No. 4,677,049 to Gritting (1987), teaches interposing a photobleachable layer between a mask and a photoresist layer and irradiating the layers through the mask. The exposed parts of the photobleachable layer bleach to form an in situ mask on the photo-resist layer and enhances the contrast of the mask image on such photo resist layer. Such enhanced mask images on the photo resist layer are used for photolithography in the manufacture of integrated electric circuits. Also see German Patent DE 3346716 A1 to Wegner et al. which appears to disclose the bleaching of polydiacetlylenes into photo-resist layers to make masks therein.

Also U.S. Pat. No. 4,808,285 to Chen et al. (1989) discloses the making of Y-couplers and gratings in polydiacetylene film by exposing same to a scanning electron beam or e-beam, which changes the index of refraction in such film to a certain depth. This is a cumbersome process which takes time and in which variation in the scanning rate and/or beam intensity can vary the depth of penetration into such film. Further the scanning beam can define ragged diagonal edges in the Y-coupler 100 of FIG. 2, resulting in beam leakage thereat. Additional beam leakage can occur in the unirradiated core 310 below the Y-coupler pattern 400, as indicated in such FIG. 2.

U.S. Pat. No. 4,270,130 to Houle et al. discloses the use of dyes in a record disk that is grooved by a laser beam that forms a deformation pattern therein, such dyes being deformed by ablation during groove formation so as to render it transparent to such recording laser beam Such beam can now be used, (even at an increased power level) for playback from such recording without destroying the recorded deformation pattern.

Accordingly the above prior art makes no suggestion of employing an uncomplex process for forming clearly defined components for integrated optics. However, there is need and market for a process that can fabricate integrated optics including structures, circuits and components thereof, that is streamlined rather than complex and otherwise overcomes the above prior art shortcomings.

There has now been discovered a simplified (and reduced temperature) process for fabricating the above optics by locating a suitable polymer and then selectively changing the index of refraction thereof to obtain such optics.

SUMMARY OF THE INVENTION

Broadly the present invention provides a method of fabricating components for integrated optics comprising irradiating a portion of a film of soluble polydiacetylene on a substrate, with light tuned within the absorption band of such polymer, in air, to photobleach such film portion while applying lesser or no bleaching to at least part of such film adjacent such film portion, to reduce the refractive index of such film portion below that of such film part, to define an optical component in such lesser bleached portion.

The invention further provides an integrated optic comprising a film of soluble polydiacetylene including poly-4BCMU, on a substrate, which film has a photobleached portion and a lesser or unbleached part, adjacent said portion, said portion having a lesser index of refraction than said part to provide a reflective interface or boundary therewith and to define an optical component in said part.

By "poly-4BCMU", as used herein, is meant; poly[5,7-dodecadiyn-1,12-diol-bis(n-butoxycarbonyl-methylurethane)], which polymer is a polydiacetylene.

By "lesser or unbleached (film) part", as used herein, is meant a film part that is, e.g. under the edges of a mask and is less bleached than irradiated film beyond the outlines of the mask but may be more bleached than unbleached film including film well under such mask.

BRIEF DESCRIPTION OF THE DRAWINGS

The invention will become more apparent from the following detailed specification and drawings in which.

DESCRIPTION OF PREFERRED EMBODIMENTS

Figure 1:
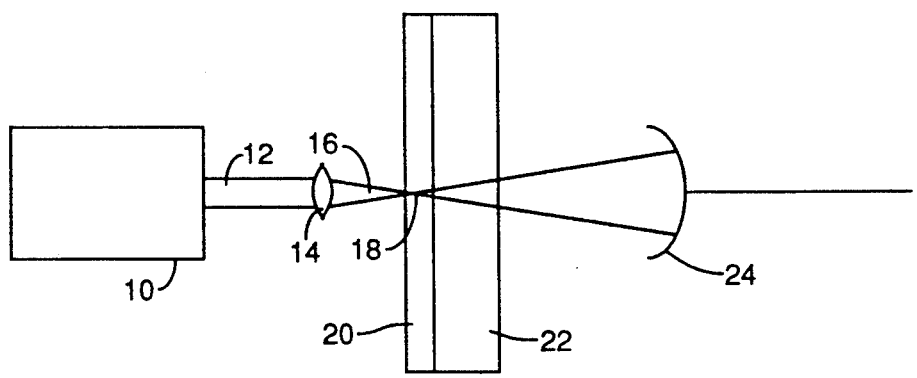
FIG. 1 is a schematic sectional elevational view of a method embodying the present invention.

Referring in more detail to the drawings, argon laser 10 directs a laser beam 12 through a focusing lens 14, which focuses a beam 16 onto a spot 18 of a polymer film 20 mounted on a glass substrate 22. The film is irradiated a sufficient time to photobleach it, e.g. after several minutes of irradiation, the laser beam bleaches the film and increasingly passes therethrough and is received by a detector 24, as shown in FIG. 1.

For purposes of the method of the present invention, it has been determined that a certain type of polymer film lends itself to the formation of integrated optics by the above photobleaching process It has been found that films of polydiacetylene are suitable, of which poly-4BCMU is highly suitable. That is, it has been found that thin film samples of poly-4BCMU become transparent or bleach when irradiated with light tuned to the absorption band of the sample. In addition the concomitant change in the refractive index thereof is appreciable as discussed below.

A suitable light is UV light which is broad-banded and can include wavelengths, λ, of 200 nm to 440 nm or more, including λ at 405 nm.

The method of the present invention takes advantage of at least two scientific principles. That is, 1) according to the invention, a selected thin film is photobleached to reduce the index of refraction in a portion thereof and 2) the so-reduced portion or portions of the film, provide reflective boundaries or interfaces with the unbleached part or parts of the film so as to define said parts as optical components, including waveguides and gratings which are integral with such film. Such film can be photobleached in a pattern e.g. with portions bleached on both sides of an unbleached part, to define a channel or waveguide in such part. Other optical components including phase gratings, can be formed in such film, as more fully described below.

By "thin film(s)", as used herein, is meant films that are from 0.2 to 5.0 um thick, with a preferred range of 0.5 to 1.5 um, including about 1 um thick.

Figure 4:
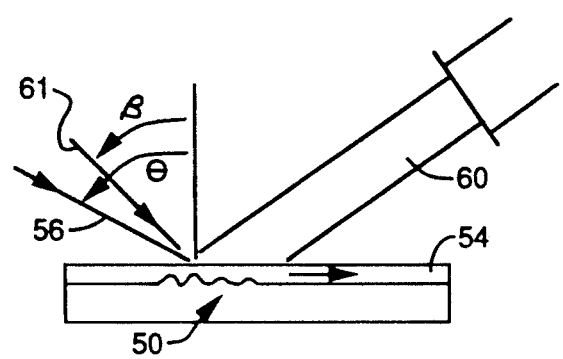
Figure 5:
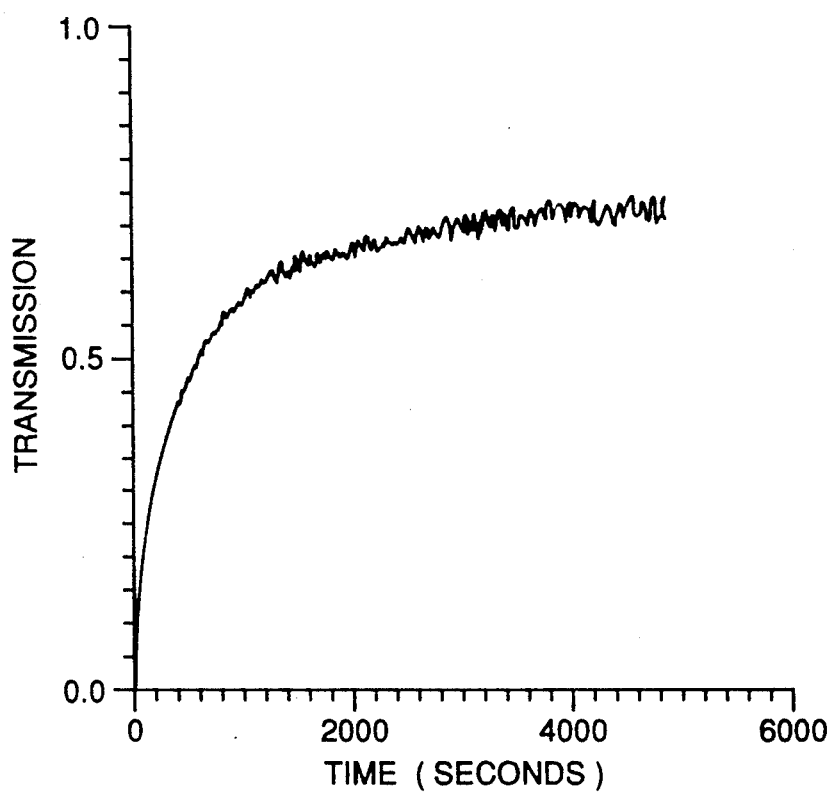
FIGS. 5, 6 and 7 are graphs illustrating certain examples of the method and article of the present invention.

Here it is noted that the arrangement shown in FIGS. 1 and 4, is suited for examining the change of physical properties in such film, before during and after photobleaching, which changes are measured and shown in the graphs of FIGS. 5, 6 and 7, as more fully discussed in the Examples given below.

Figure 2:
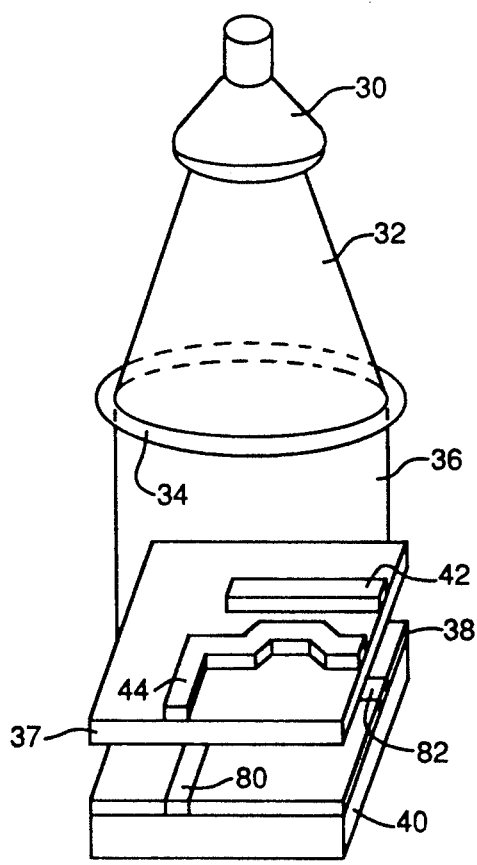
FIG. 2 is a perspective view of another photobleaching method embodying the present invention.

In an another embodiment of the present invention, UV lamp 30 directs a beam 32 through a collimating lens 34, forming a collimated beam 36, which irradiates a poly-4BCMU film 38, mounted on a glass substrate 40, which film is mounted below two optical channel-defining metal masks 42 and 44 on a glass plate 37, as shown in FIG. 2. Here, after sufficient irradiation, the film 38 is photobleached on both sides of the masking elements 42 and 44 reducing the index of refraction of the film, $n_f$, and providing reflective interfaces for the unbleached film parts under the masking strips 42 and 44. These unbleached parts now have a higher index of refraction than the bleached film portions and thus define optical channels 80 and 82, as shown in the integrated film circuit 78 of FIG. 10. Such film circuit 78 is more fully discussed below.

Figure 3:
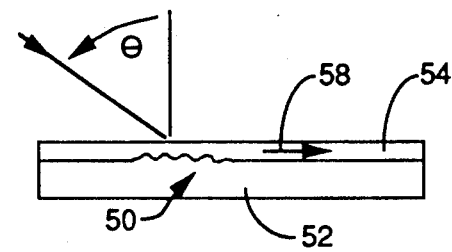
FIGS. 3 and 4 are schematic sectional elevation views of a method embodying the present invention.

A light beam can enter a waveguide in a film through the film edge as discussed below with respect to FIG. 10. A light beam can also enter a waveguide in a film, coming in at an angle with the surface of such film, provided a coupling means or grating is provided in such film. In the prior art grating couplers have been formed by, e.g. ion milling of ridges and grooves either into the surface of the film above a channel or the surface of such film or substrate below a channel, which grating can couple a major portion of an incoming incident beam into the film channel, the rest of the beam being reflected or transmitted as is known in the prior art. Thus a grating 50 of ridges and grooves, having been milled into a glass substrate 52, is covered with a polydiacetylene film 54, as shown in FIG. 3. Such ridged and grooved phase grating is known as a surface relief grating. When a beam 56 of a suitable wavelength, e.g. λ=700 nm, per the graph of FIG. 6, more fully discussed below, is directed at the grating 50, at a suitable incident angle θ, most of the beam will be coupled into a waveguide 58 of the film, the remainder of the beam being reflected, absorbed or transmitted, as noted above.

When the film above the grating 50 is irradiated by a light beam 60 (per FIG. 4), tuned to the absorption band of such polymer film, that film portion is photobleached (and made more transparent), which induces a reduction in the refractive index of the polydiacetlylene film.

This drop in refractive index can be measured since the incident angle at which the above light beam 56 will couple into the waveguide of the film 54, is now reduced to angle β with the incoming beam moved to the position of arrow 61, as shown in FIG. 4.

Thus the refractive index of the film is reduced with increasing exposure to irradiation, as shown in FIG. 4 and the coupling incident angle of the incoming beam to the grating 50 is accordingly reduced.

As noted above, photobleaching of the polydiacetylene films by the method of the present invention renders film that was opaque to light at certain wavelengths, increasingly transparent, that is, the absorbance of such wavelength is decreased by irradiation of such film by light tuned within the absorption band thereof. Such change in absorbance is shown in the graph of FIG. 6 wherein absorbance on the ordinate is plotted against wavelength on the abscissa and curve 64 is the aborbance of such film before irradiation, curve 66 is the absorption thereof during irradiation, and curve 68 is the absorbance of such film after photobleaching. It can be seen from the curve of 64 that such film is absorbant to light at wavelengths of about 350 to 550 nm, i.e. is opaque to such wavelengths. Accordingly such wavelengths cannot be transmitted in the unbleached channels or waveguides of the film employed in the present invention since they would be absorbed, as indicated in FIG. 6. However, light of wavelengths of 600 nm and above, can be transmitted in the (unbleached) film waveguides of the invention since the unbleached film is transparent thereto. However, the remainder of the film, e.g. film 71 of FIG. 10, is bleached on both sides of the respective waveguides 80 and 82, to provide, as noted above, reflective interfaces or boundaries of lower indices of refraction to keep the transmitted light in the respective waveguide 80 or 82.

Returning now to FIG. 4, when the film 54, above the grating 50 is irradiated by laser beam 60 at, e.g. 514.5 nm to photobleach such film, the index of refraction thereof is progressively lowered for all wavelengths above 600 nm and likely for wavelengths of 600 nm and below. Thus the incoming light beam incident angle at a coupling grating, per FIG. 4, will be reduced for all wavelengths above 600 nm and likely for wavelengths 600 nm and below, as said grating is photobleached per the method of the present invention. Accordingly progressive measurements of the reduction of incident angle of a selected wavelength, e.g. λ=1064 nm, can be made to calculate progressive reductions in the index of refraction of such film, during irradiation, to provide a plot thereof, such as shown in FIG. 7, as discussed more fully in Example III below.

Figure 7:
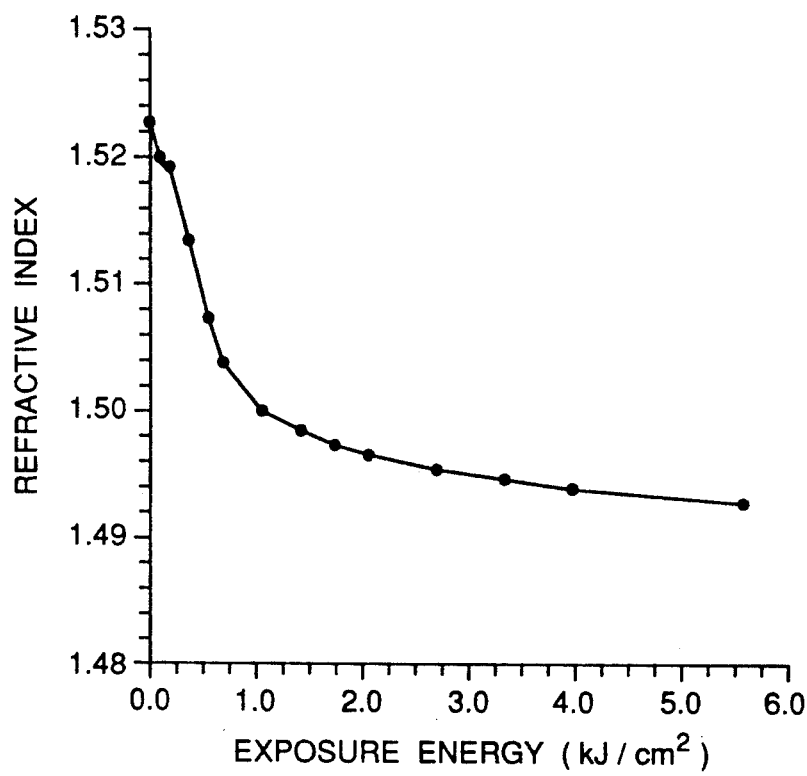

While the surface relief grating 50 shown in FIGS. 3 and 4, can be employed in the integrated optical circuits of the present invention, its use as described with respect to FIG. 4, is for data-gathering purposes, e.g. for the graph shown in FIG. 7. Similarly the arrangement shown in FIG. 1, of irradiating such film with a focused laser beam (the progressive transmission therethrough being read by a detector) is, e.g. used for data-gathering purposes such as in the graph shown in FIG. 5, more fully discussed below.

In addition to defining optical channels by boundary photobleaching of such film, the invention provides other optical components, including a grating that does not require a physical reshaping, e.g. ion milling of film or substrate. That is, the method of the invention provides for photobleaching of a coupling grating in such film, herein denoted a phase grating.

Figure 8:
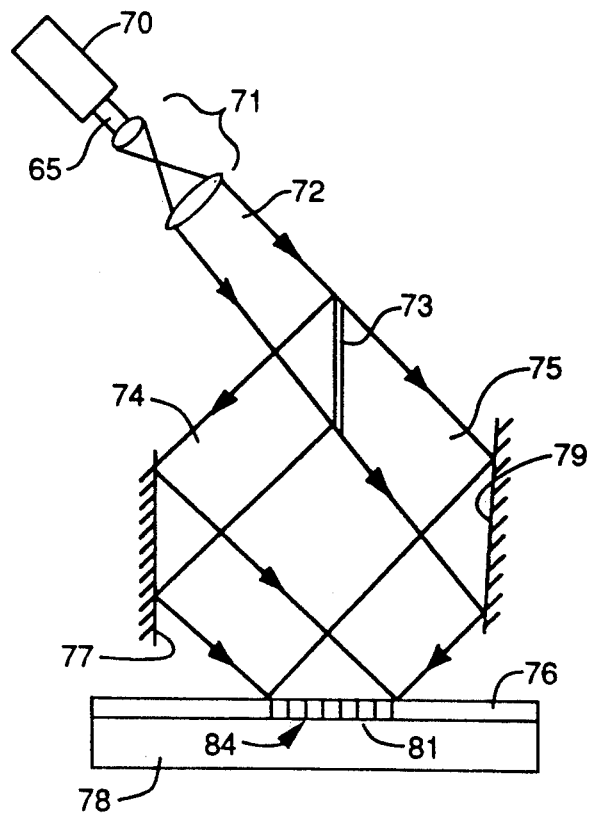
FIG. 8 is a schematic sectional elevation view of another method embodying the present invention.
Figure 9:
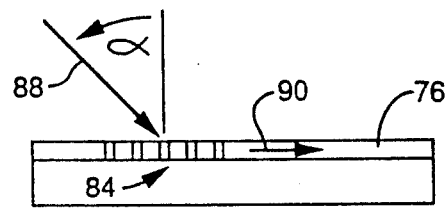
FIG. 9 is a schematic sectional elevation view of another optical component embodying the present invention; and, FIG. 10 is a perspective view of an integrated optic product embodying the present invention.

Thus laser diode 70 directs laser beam 65 through a lens combination 71 to produce a collimated light beam 72, as shown in FIG. 8. The collimated beam 72 is split into two separate beams of equal intensity 74 and 75 by an optical beamsplitter 73. Two mirrors 77 and 79, redirect the light beams to optically interfere at a spot 81 in the polydiacetylene film 76, which has been deposited onto a glass substrate 78. The relative angle of the interfering beams is adjusted in order to define the periodicity of the constructive and destructive interference zones, which provide a phase grating of modulated refractive index 84, as shown in FIG. 8. Thus a light beam 88, incoming at a suitable incident angle $\alpha$, is coupled by the phase grating 84 into a waveguide in the film, as indicated by the arrow 90, shown in FIG. 9.

However, the phase grating embodying the invention does not change its coupling angle by photobleaching in the manner described above with respect to FIGS. 3 and 4, since such photobleaching is detrimental to the phase grating of the invention, itself formed by photobleaching of two interfering beams, as noted above.

Figure 10:
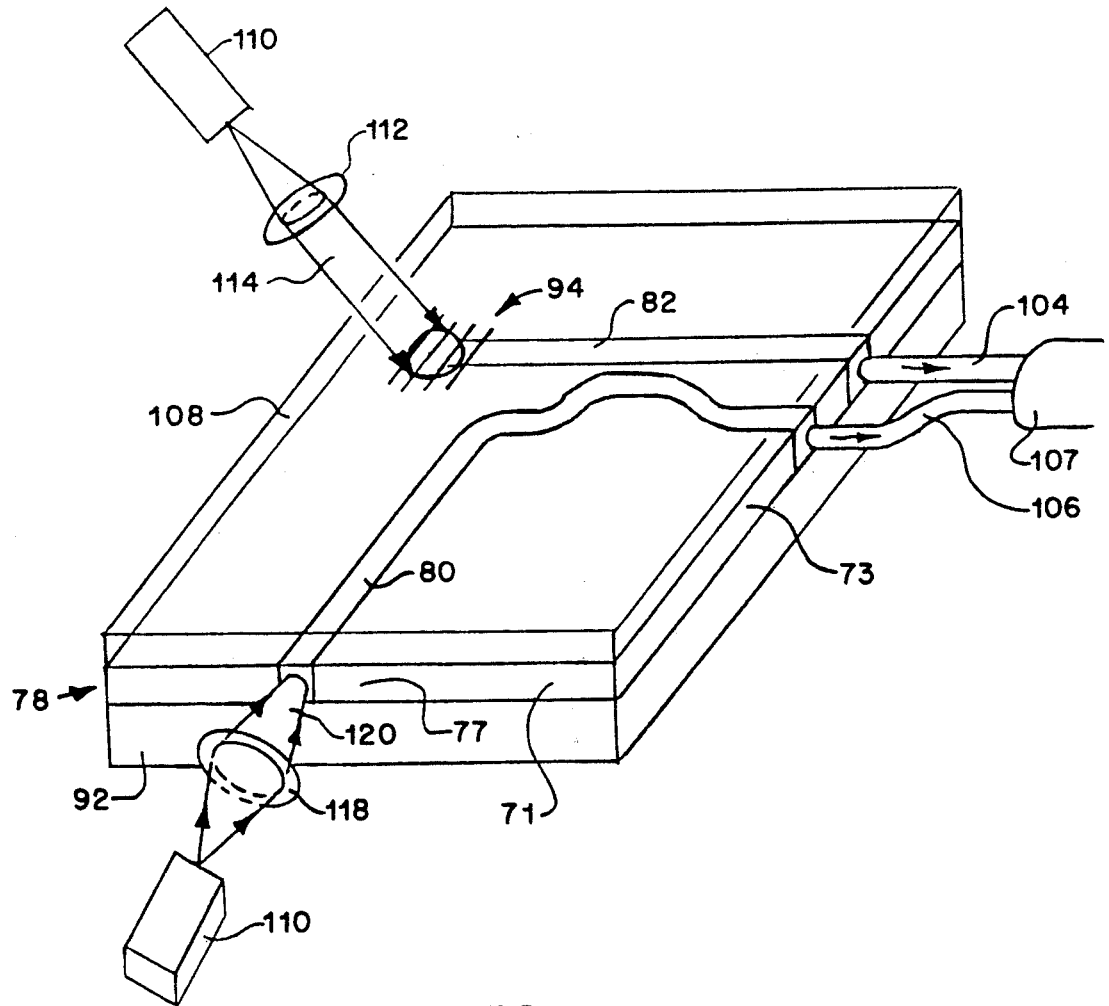

An integrated optical circuit according to the invention, is shown in FIG. 10, wherein polydiacetylene film 71 is mounted on glass substrate 92 and has lesser or unbleached waveguides 80 and 82, defined in such film 71. A phase grating 94 in the film 71 optically connects with the waveguide 82, as shown in FIG. 10. Preferably the phase grating 94 is fabricated in the film 71, e.g. in the manner shown in FIG. 8, before the waveguides 80 and 82, which are then fabricated, e.g. per the method shown in FIG. 2.

Also an optical fiber 104 connects with waveguide 82 and an optical fiber 106 connects with waveguide 80 at the film edge 73, as shown in FIG. 10. For refractive index durability, the integrated optic circuit 78 is encapsulated with an epoxy layer 108, which has a refractive index below that of the lesser or unbleached waveguides 80 and 82 as does the glass substrate 92, so that such waveguides are enclosed on all sides by reflective interfaces of lower indices of refraction, as indicated in FIG. 10.

In operation, a laser diode 110 directs through a lens 112, a laser beam 114 into the phase grating 94 to couple into the waveguide 82 and thence to the optic fiber 104, as shown in FIG. 10. Concurrently or separately, laser diode 116 directs through lens 118, laser beam 120 into waveguide 80, at the edge of the film 77 and thence to optic fiber 106, as shown in FIG. 10.

Accordingly, the methods of the present invention provide for fabricating an integrated optical circuit of considerable compactness and versatility.

Thus the invention provides methods to produce integrated optical components including waveguides and phase gratings by irradiating polydiacetylene films including poly-4BCMU, directly, with or without masks through photolithographic processing. The photobleaching process renders transparent such films and induces reduction in the refractive index thereof as noted above. After exposure the photobleached product can be stabilized by encapsulating the material as noted above.

The following examples are intended to illustrate the invention and should not be construed in limitation thereof.

EXAMPLE I

Poly-4BCMU was mixed 5% by weight with cyclopentanone and dissolved into solution by overnight heating (about 12 hours) at between 60° to 100° C., while continuously stirring the mixture. The solution was spin-coated at 1000 rpm for 60 seconds onto clean microscope (glass) slide substrates to form thin films (about 0.5 to 1.5 um thick). The film samples were allowed to sit overnight (about 12 hours) to permit evaporation of excess solvent.

The spin-coated poly-4BCMU samples were exposed to an focused beam from an argon laser (514.5 nm at 7.5 mW with 400 um FWHM). FWHM means full (beam) width at half maximum (intensity). FIG. 5 shows the results of such photobleaching where the transmission of such focused laser beam was measured as a function of time. After irradiating for 300 seconds (about 1.8 kJ/cm$^2$ total exposure) the transmitted intensity reached half the saturation value as indicated in the graph of FIG. 5. Absorption spectra of the film for various exposure energies are displayed in FIG. 6.

When a mask was placed in close contact over the film in the path of the laser beam, e.g. the observed transition between bleached and unbleached bleached regions of the film were sharp.

EXAMPLE II

Employing further spin-coated poly-4BCMU samples on glass substrates, made in the manner described in Example 1, such films were irradiated with a focused HeCd laser beam (442 nm at 1.35 mW with a 500 um FWHM). After irradiating for about 230 seconds (about 160 J/cm$^2$ exposure) the transmitted intensity reached 50% of saturation value in the manner indicated in the graph of FIG. 5. Again the observed transition between bleached and unbleached regions of such film samples, was sharp.

The same experiment was performed for a similar sample maintained in a vacuum cell at a vacuum pressure of 300 millitorr. In this case, the sample in the vacuum did not bleach after 14 hours of continuous irradiation. However, after the vacuum cell was brought to atmospheric pressure, the sample bleached in about 500 seconds when exposed to the laser radiation. The increase in bleaching time is attributed to the film having less O$_2$ therein than normal.

EXAMPLE III

A 630 nm period grating was masked and ion-milled into fused silica substrate slides to form relief gratings therein. The 5% by weight solution of poly-4 BCMU/cyclopentanone solution was deposited on such slides and allowed to sit for 10 minutes to allow polymer concentration to increase through solvent evaporation. The so-coated slides were then spun at 300 rpm for about 30 seconds, leaving a thin layer of solution thereon. The remaining solvent was allowed to evaporate, leaving a solution-cast film about 4 um thick on such relief grating slides, such as shown in FIG. 3 hereof. The resulting film thickness had regions of good uniformity for accurate coupling measurements. Coupling angles were measured using a computer-controlled rotation stage and were obtained for three TE polarized waveguide modes at 1.064 um or 1064 nm.

The coupling spot was irradiated (e.g. as shown in FIG. 4) with 420 mW of 514 nm argon laser radiation and a 3 mm FWHM beam and coupling angles were measured after irradiation. The process was repeated with the same spot being periodically irradiated and such coupling angles being measured thereafter. The refractive indices and film thicknesses were obtained by inverting the waveguide dispersion relation, assuming a planar waveguide geometry. The results of these measurements, showing a decrease in refractive index with increasing irradiation are shown in the graph of FIG. 7.

As shown, the refractive index of the exposed poly-4BCMU film was reduced by as much 0.029 at $\lambda = 1.064$ um while the thickness remained unchanged. This refractive index change is sufficient to write channels and phase gratings in such film. Further it has been found that by heating (with stirring) the solution of Example I, for a shorter period than given in such Example, e.g. for 1 hour at 60° to 100° C., then allowing it to cool to room temperature (about 20° C.) With stirring, for 3 to 4 more hours, then spin coating the solution onto glass slides per Example I, that the resulting polymer film has a sufficiently higher refractive index so as to reduce, by photobleaching by up to 0.08 (down to about 1.49 for such bleached film). As indicated above, the channels are written by irradiating and photobleaching films of soluble polydiacetlylene with portions thereof being masked to provide unbleached channels or waveguides, as discussed above. The phase gratings are formed by directing interfering laser beams to a coupling spot on such film, as previously discussed above and below.

EXAMPLE IV

A phase grating with period $\lambda = 1.7$ um was formed in spin-coated poly-4BCMU thin film. This was done by directing a pair of interfering argon laser beams at a coupling spot on the film, each at an opposite angle of 19 degrees with the film surface, at $\lambda = 514.5$ nm, with an intensity of 30 mW for 300 seconds. Thus by the method shown, e.g. in FIG. 8, a phase grating was quickly and readily inscribed in such film.

Thereafter, a channel or waveguide connecting with such grating was formed in the poly-4BCMU film by covering a portion thereof connecting with such grating, with a metalized mask and exposing the film with an ultraviolet source(HTG LS-60 UV light source system); for 15 minutes, at about 20 W/cm² in the manner indicated in FIG. 2.

Thus, in the manner shown in FIG. 8, a phase grating was readily and quickly inscribed in such polymer film, followed by installation of a connecting waveguide to quickly provide integrated optical components per the method of the present invention.

As noted above, the invention provides for photobleaching polydiacetylene film to provide integrated optics at low cost. Preferred are films of poly-4BCMU. Such films are preferably deposited on transparent substrates such as glass. Such films can be irradiated per the method of the invention by laser beam, white light or UV light depending upon the application thereof. Of course gratings are formed in such film by interfering two laser beams at a coupling spot on the film, as discussed above.

The benefit of the photobleaching of such film is that it lowers the refractive index of such film on both sides of the unbleached channel so as to keep an applied or coupled light beam in such channel by reflectance at the interfaces thereof. And gratings are added to such integrated circuit as discussed above.

Figure 6:
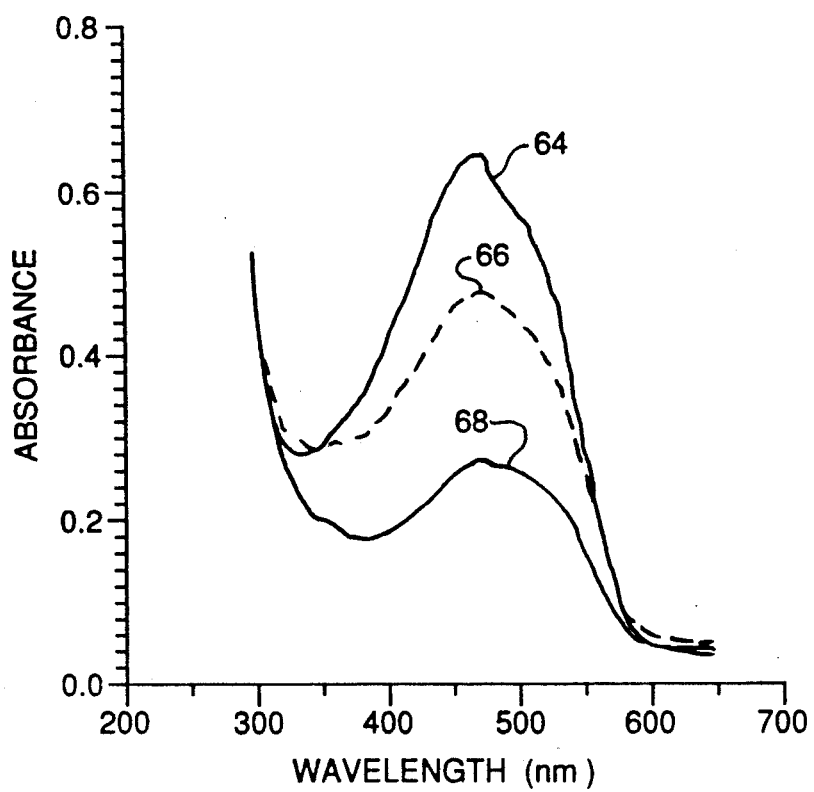

Per the graph of FIG. 6, such unbleached channels will accept and not absorb wavelengths greater than 600 nm which render such integrated optics, including phase gratings, waveguides and optical interconnects, highly suitable for communication wavelengths, which are within the range of, e.g. 1300 to 1500 nm.

As noted above, various lights can be employed to bleach such film provided it be tuned within the absorption band of such film. Thus, looking at FIG. 6, it can be seen that an (unfocused) argon laser beam tuned to 514.5 nm is of suitable wavelength to bleach such film.

Of course as the channels are lesser or unbleached portions of the film, the light transmitted therein must be of a wavelength greater than 600 nm to render such channels transparent thereto, as discussed above.

Thus photo-induced bleaching can occur by exposing spin-coated or solution cast soluble polydiacetylene films, e.g. poly-4BCMU in open air, to light tuned to within the adsorption band of the polymer. This effect is believed caused by oxidation of the poly-4BCMU. This effect can be quite useful because refractive index changes of 0.029 (or more) allow integrated optic components and circuits to be formed directly, by proper exposure of such polymer film. The novel methods of the invention also provide novel products, i.e. the integrated optics including the components thereof, such as phase gratings and optical channels or waveguides. Encapsulating the exposed film after removal of residual gas therein, stabilizes the integrated optical products from further bleaching.

Thus the methods of the invention can lead to low cost, low temperature, single step fabrication of integrated optical patterns for integrated optics, optical interconnects, non linear, integrated optics and passive linear, integrated, optical circuits. In addition there are applications in the area of low-cost polymer, read-write heads for optical data storage.

What is claimed is:

1. A method for fabricating components for integrated optics comprising irradiating a portion of a film of soluble polydiacetylene on a substrate with light tuned within the absorption band of such polymer, in air, to photobleach such film portion on at least two sides of a lesser bleached or unbleached part of said film, to reduce the refractive index of said film portion below that of such film part and define an optical path or waveguide in such film part.

2. The method of claim 1 wherein said polydiacetlylene film is a film of poly-4BCMU.

3. The method of claim 1 wherein said light is an unfocused or focused laser beam, a white light or UV light.

4. The method of claim 1 comprising cross-irradiating a portion of said film with a first laser beam at one angle and directing a second laser beam from the same laser at said portion at a different angle, to interfere with said first laser beam to define a phase grating in said film.

5. The method of claim 4 wherein an unbleached path, extending to said grating, is selected and photobleaching on two sides of said path, to define in the lesser bleached or unbleached path, a waveguide which optically communicates with said phase grating.

6. The method of claim 1 wherein said film is of poly-4BCMU.

7. The method of claim 1 wherein said film is photobleached in a pattern for integrated optical applications.

8. The method of claim 7 wherein said film is masked and said film is irradiated adjacent the masked components to photobleach the unmasked portions of said film and define part of said film.

9. The method of claim 1 wherein said film is 0.5 to 1.5 um thick.

10. The method of claim 1 wherein said film has been previously deposited on a glass substrate.

11. The method of claim 1 wherein the index of refraction of poly-4BCMU is reduced by up to 0.08 for a wavelength of 1064 nm.

12. The method of claim 1 wherein the so-bleached film is encapsulated by an epoxy layer of lesser refractive index than such lesser or unbleached film part.

13. The method of claim 1 wherein said film is irradiated by a plurality of laser beams which intersect at the surface of said film to photobleach same in a pattern and form a phase grating therein.

14. An integrated optic comprising a film of soluble polydiacetylene on a substrate, which film has photobleached portions on at least two sides of a lesser bleached or unbleached part, said portions each having a lesser index of refraction than said part to provide reflective boundaries thereat so that said part defines a waveguide in said film.

15. The optic of claim 14 having a phase grating photobleached therein.

16. The optic of claim 15 having a lesser or unbleached part or pathway extending to said phase grating to define a waveguide or channel which optically communicates with said phase grating.

17. The optic of claim 14 wherein said film is of poly-4BCMU.

18. The optic of claim 14 wherein said film has a pattern of lesser bleached or unbleached parts as optic components therein.

19. The optic of claim 14 wherein said film is 0.5 to 1.5 um thick.

20. The optic of claim 14 wherein said film is deposited on a glass substrate.

21. The optic of claim 20 wherein said film is photobleached in a pattern for integrated optical application.

22. The optic of claim 14 wherein the index of refraction of poly-4BCMU is reduced by p to 0.08 for a λ of 1064 nm.

23. The optic of claim 14 wherein the so-bleached film is covered by a layer of lesser index of refraction than each lesser bleached or unbleached film part so that said layer and said substrate form reflective boundaries for optic components in said film.

24. The optic of claim 14 wherein said film is photobleached around lesser bleached or unbleached portions which define optical components selected from the group consisting of optical interconnects, waveguides, phase gratings and polymer read-write heads for optical data storage.

25. The optic of claim 24 encapsulated by an epoxy of lesser refractive index than said components for refractive index durability.

26. A method for fabricating integrated optical components in a film comprising, placing a film of soluble polydiacetylene on a glass substrate and photobleaching two spaced portions of said film to reduce the index of refraction of each film portion relative to the lesser bleached or unbleached film part therebetween to define said part as an optical channel.

27. The method of claim 26 wherein said film is bleached in spaced lines or bars to define a phase grating.

28. The method of claim 26 wherein the so-bleached film surface is encapsulated with a transparent layer of a lower index of refraction than the unbleached film.

* * * * *